United States Patent [19]

Sakamoto

[11] Patent Number: 5,119,199

[45] Date of Patent: Jun. 2, 1992

[54] FM DEMODULATOR FOR VIDEO TAPE RECORDER

[75] Inventor: Etsurou Sakamoto, Kanagawa, Japan

[73] Assignee: Sony Corporation, Tokyo, Japan

[21] Appl. No.: 527,859

[22] Filed: May 24, 1990

[30] Foreign Application Priority Data

May 25, 1989 [JP] Japan .................. 1-P132220
Jan. 16, 1990 [JP] Japan .................. 2-P006835

[51] Int. Cl.⁵ .................................. H04N 5/455
[52] U.S. Cl. .................. 358/188; 329/316; 329/336
[58] Field of Search ........... 358/188; 329/316, 327, 329/336; 375/80

[56] References Cited

U.S. PATENT DOCUMENTS

| | | | |
|---|---|---|---|
| 3,562,416 | 2/1971 | Emmasingel | 358/188 |
| 3,626,090 | 12/1971 | Akiyama et al. | 358/188 |
| 4,602,380 | 7/1986 | Stebbings | 329/327 |
| 4,629,994 | 12/1986 | Shimotashiro et al. | 329/327 |
| 4,656,432 | 4/1987 | Matsumura | 455/214 |
| 4,782,385 | 11/1988 | Gunter et al. | 358/188 |
| 4,804,924 | 2/1989 | Chassaing et al. | 329/316 |
| 4,910,468 | 3/1990 | Ohtsuka et al. | 329/316 |
| 4,929,905 | 5/1990 | Ruitenburg | 358/188 |
| 4,959,620 | 9/1990 | Honjo | 329/336 |

FOREIGN PATENT DOCUMENTS 60-119104  6/1985  Japan .

Primary Examiner—James J. Groody
Assistant Examiner—Jeffrey S. Murrell
Attorney, Agent, or Firm—Hill, Van Santen, Steadman & Simpson

[57] ABSTRACT

An imput for receiving FM modulated video signals is connected to a first demodulator circuit, the output of which is connected to the first input of an adder. The input is also connected to a transversal filter, the output of which feeds a Hilbert transform circuit that has its output connected to a second demodulator circuit. The output of the second demodulator is connected to a second input of the adder, the adder providing an FM demodulated video signal with reduced moiré and improved signal-to-noise ratio. In a second embodiment, the Hilbert transform circuit is formed by delay circuits and a subtraction circuit connected to subtract the output of the delay circuits from the input thereto. An adder is connected to add the output of the delay circuits to the input thereto. First and second demodulation circuits receive the outputs from the subtractor and adder, respectively, and the outputs of the first and second demodulation circuits are mixed to produce the FM demodulated video signal.

4 Claims, 6 Drawing Sheets

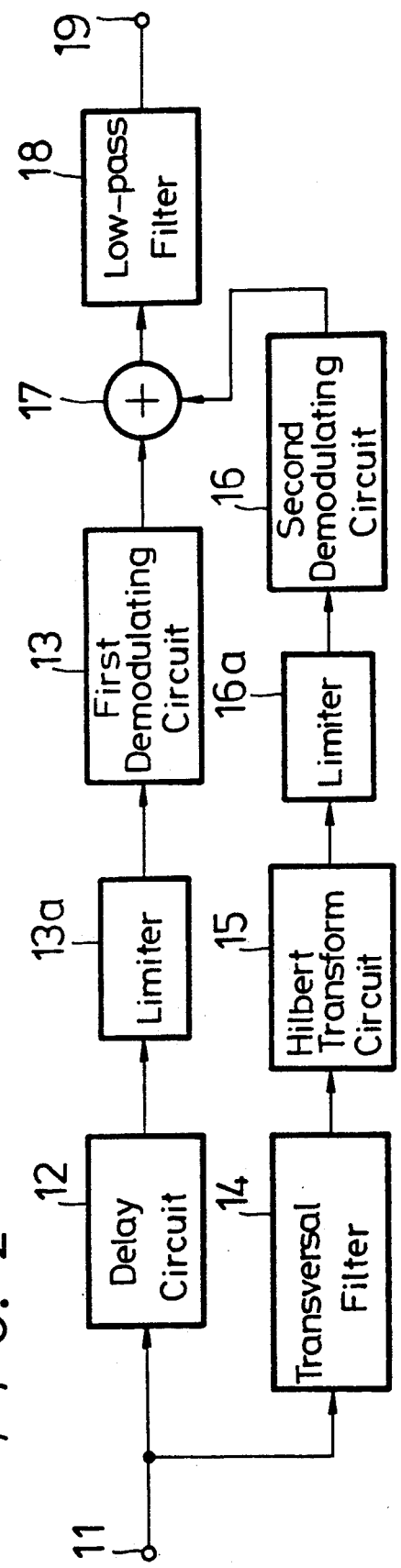
F I G. 2

FIG. 3
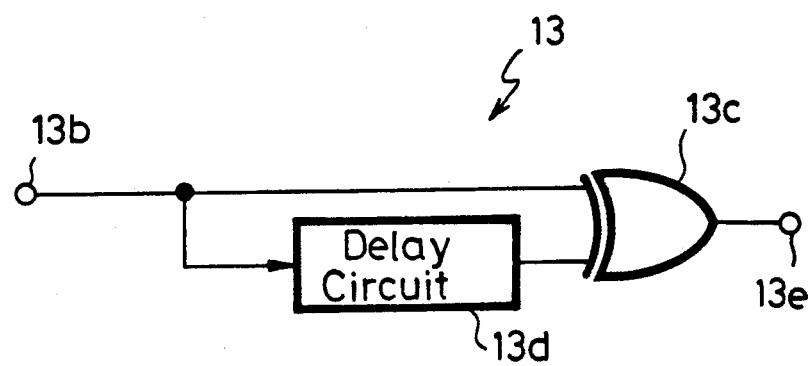
FIG. 4A Input Signal
FIG. 4B Delay Signal
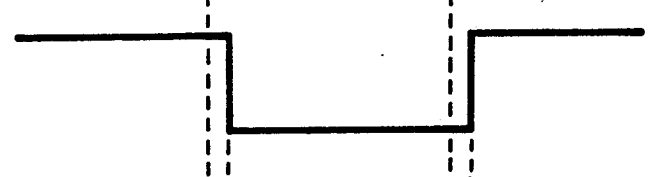
FIG. 4C Output Signal

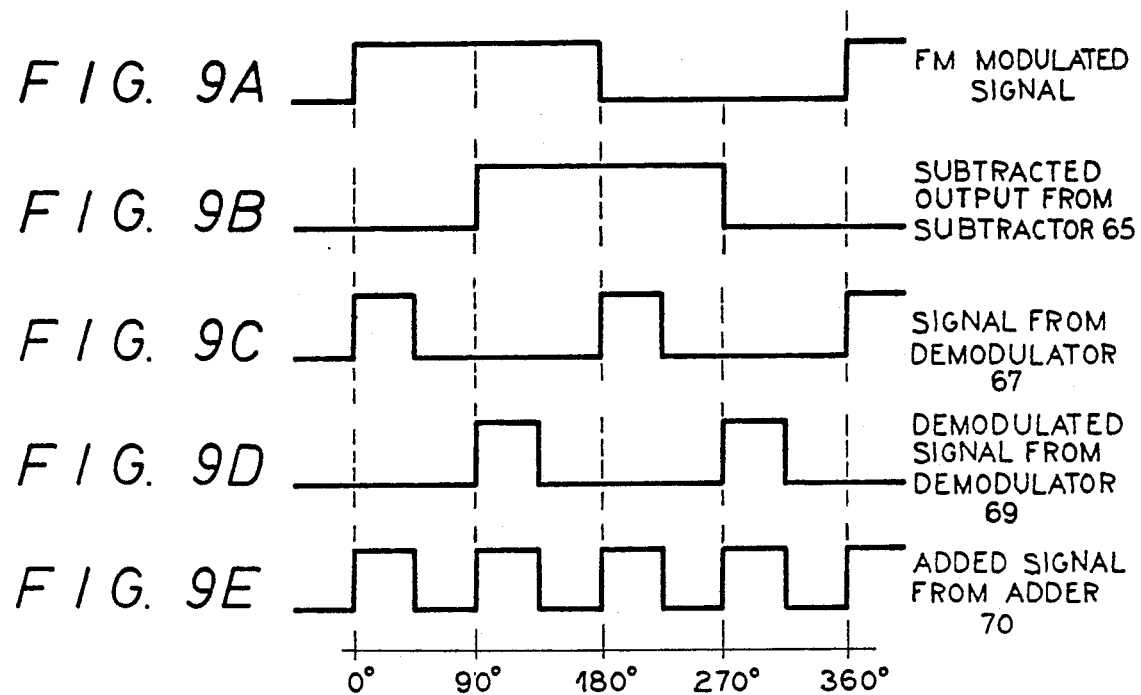
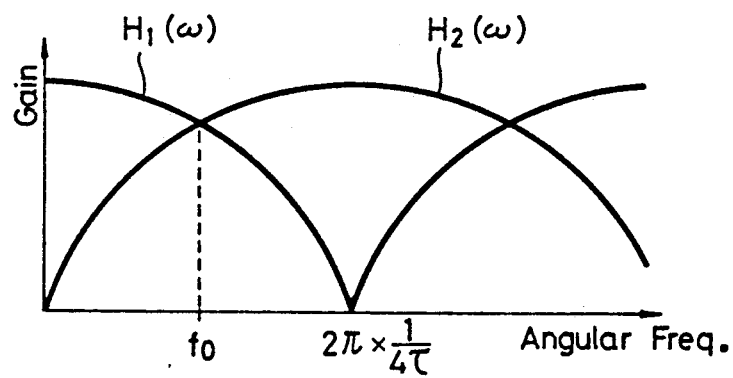

FM DEMODULATOR FOR VIDEO TAPE RECORDER

BACKGROUND OF THE INVENTION

1. Field of the Invention

The present invention relates generally to FM demodulating apparatus and, more particularly, is directed to an FM demodulating apparatus suitable for use in a video tape recorder (VTR) to demodulate a video signal which is FM-modulated and then recorded.

2. Description of the Prior Art

A prior-art video tape recorder (VTR) utilizes an FM demodulating apparatus to FM-demodulate a reproduced signal of an FM luminance signal recorded on a magnetic tape. FIG. 1 shows an example of a previously-proposed FM demodulating apparatus.

Referring to FIG. 1, an input terminal 1 is supplied with a video signal which is FM-modulated by a carrier of a relatively low frequency and reproduced by a video tape recorder and the like. The FM-modulated video signal applied to the input terminal 1 is supplied to an FM demodulator 2 of a pulse count type and to a 90-degrees phase shifting circuit 3. The 90-degrees phase shifting circuit 3 shifts, i.e., delays the phase of the input video signal by 90 degrees. A video signal from the 90-degrees phase shifting circuit 3 is supplied to an FM demodulator 4 of a pulse count type. Demodulated signals from the two FM demodulators 2 and 4 are supplied to an adder 5, and an added signal from the adder 5 is supplied to a low-pass filter 6. Thus, the high frequency component of the added signal is filtered-out by the low-pass filter 6 and is then fed to an output terminal 7. Therefore, the FM-demodulated video signal is developed at the output terminal 7. In the FM-demodulated video signal at the output terminal 7, the occurrence of so-called moiré, i.e., an undesirable high frequency produced around a frequency twice as high the carrier due to the side band wave, can be alleviated.

Recently, a video signal transmitting system is developed, in which a picture of high resolution, i.e., a high-definition television picture, is displayed. This high-definition television system processes a signal involving a high band component having a band width wider than that of the video signal according to the standard broadcasting system such as an NTSC system or the like. For this reason, when a high-definition television video signal is demodulated by the above-described FM demodulating apparatus, the undesirable high frequency component produced about the frequency twice the carrier frequency due to the side band wave cannot be suppressed satisfactorily.

As described above, this undesirable high frequency component produced about the frequency which is twice as high as the carrier frequency due to the side band wave is what might be called a moiré. The moiré occurs because the frequency characteristics of the input signal to the FM demodulator 2 and the input signal to the FM demodulator 4 are changed by the phase-shifting operation in the 90-degrees phase shifting circuit 3.

OBJECTS AND SUMMARY OF THE INVENTION

Accordingly, it is a general object of the present invention to provide an improved FM-demodulating apparatus which can eliminate the aforenoted shortcomings and disadvantages encountered with the prior art.

More specifically, it is an object of the present invention to provide an FM-demodulating apparatus which can satisfactorily demodulate FM-modulated video signals having high frequency components such as a high definition television signal and the like.

It is another object of the present invention to provide an FM demodulating apparatus by which a signal-to-noise (S/N) ratio of an FM-demodulated video signal can be improved.

It is still another object of the present invention to provide an FM demodulating apparatus by which the occurrence of a so-called moiré can be reduced.

It is a further object of the present invention to provide an FM demodulating apparatus in which a moiré occurred in an edge portion of a synchronizing signal can be reduced so that a jitter component can be detected from a reproduced synchronizing signal with ease.

According to a first aspect of the present invention, an FM demodulating apparatus is comprised of an input terminal to which FM-demodulated video signals are supplied, a first demodulator circuit coupled to the input terminal, a Hilbert transform circuit coupled to the input terminal for phase-shifting the FM-modulated video signals by 90 degrees, a second demodulator circuit coupled to the Hilbert transform circuit, and a mixing circuit coupled to the first demodulator circuit and the second demodulator circuit for deriving FM-demodulated video signals.

As a second aspect of the present invention, an FM demodulating apparatus is comprised of an input terminal to which FM-modulated video signals are supplied, a Hilbert transform circuit coupled to the input terminal for phase-shifting the FM-modulated video signals by 90 degrees, the Hilbert transform circuit including delay circuits and a subtracting circuit, an adding circuit coupled to the delay circuits included in the Hilbert transform circuit, a first demodulator circuit coupled to the adding circuit for demodulating signals obtained from the adding circuit, a second demodulating circuit coupled to the subtracting circuit of the Hilbert transform circuit for demodulating signals obtained from the subtracting circuit, and a mixing circuit coupled to said adding means and the subtracting circuit of the Hilbert transform circuit for deriving FM-demodulated video signals.

The preceding, and other objects, features and advantages of the present invention will be apparent in the following detailed description of the preferred embodiments when read in conjunction with the accompanying drawings, in which like reference numerals are used to identify the same or similar parts in the several views.

BRIEF DESCRIPTION OF THE DRAWINGS

FIG. 2 is a block diagram showing a first embodiment of an FM demodulating apparatus according to the present invention;

FIG. 3 is a schematic diagram showing an example of a pulse count type demodulating circuit used in the present invention;

FIGS. 4A to 4C are waveform diagrams of an input signal, a delay signal and an output signal used in the present invention, and to which reference will be made in explaining an operation of the pulse count type demodulating circuit shown in FIG. 3;

FIGS. 9A to 9E are waveform diagrams to which reference will be made in explaining an operation of the second embodiment shown in FIG. 8; and FIG. 10 is a diagram of a frequency characteristic graph used to explain the second embodiment of the present invention.

DETAILED DESCRIPTION OF THE PREFERRED EMBODIMENTS

Figure 1:
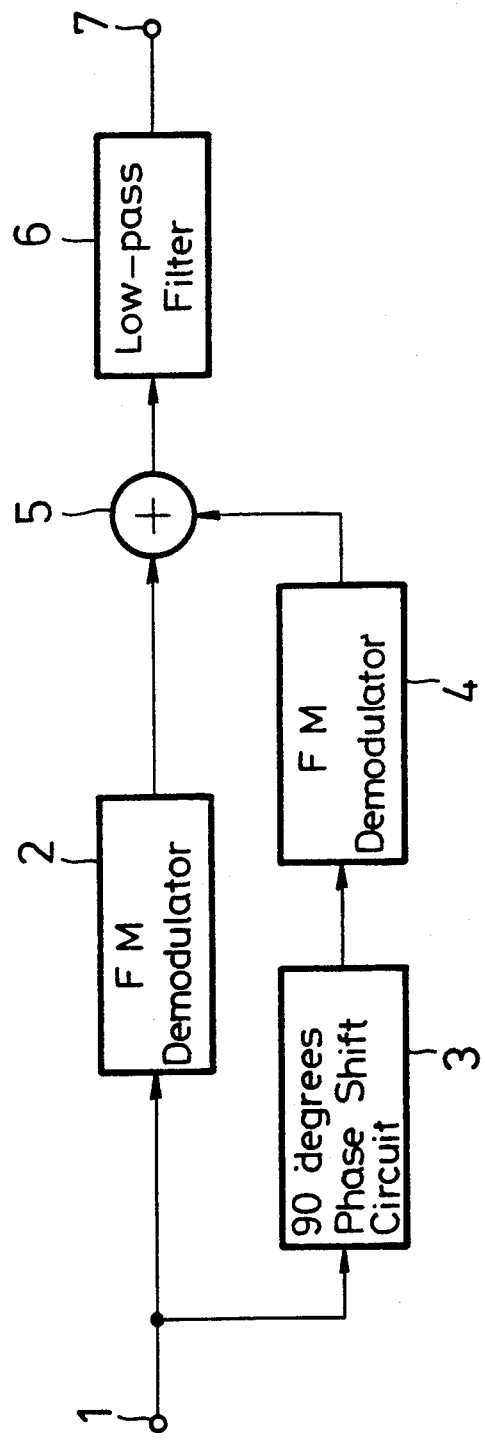
FIG. 1 is a block diagram showing an example of a prior-art FM demodulating apparatus.

Referring to the drawings in detail, and initially to FIG. 2, a first embodiment of the FM demodulating apparatus according to the present invention will be described hereinafter.

FIG. 2 shows a fundamental arrangement of the first embodiment of the FM demodulating apparatus according to the present invention.

As shown in FIG. 2, there is shown an input terminal 11 to which there is supplied an FM-modulated video signal reproduced by a video tape recorder and the like. The FM-modulated video signal applied to the input terminal 11 is supplied through a delay circuit 12 and a limiter 13a to a first demodulating circuit 13. Further, the video signal applied to the input terminal 11 is supplied through a transversal filter 14, a Hilbert transform circuit 15 and a limiter 16a to a second demodulating circuit 16. In that case, the transversal filter 14 functions as a linear phase gain-frequency characteristic correcting filter to provide a substantially flat frequency characteristic, whereas the Hilbert transform circuit 15 functions as a 90-degrees phase shifting circuit. Furthermore, the first and second demodulating circuits 13 and 16 might be pulse count type FM-demodulating circuits whose characteristics are equal.

An arrangement of the pulse count type FM-demodulating circuit 13 will be described more fully with reference to FIG. 3.

Referring to FIG. 3, an FM-modulated signal applied to an input terminal 13b is directly supplied to one input terminal of an exclusive-OR gate 13c, and is also supplied through a delay circuit 13d to the other input terminal of the exclusive-OR circuit 13c. An exclusive-OR output from the exclusive-OR gate 13c is fed to an output terminal 13e of the FM-demodulating circuit 13.

The FM-demodulating circuit 13 is constructed as described above so that, when an FM-modulated signal shown in FIG. 4A is supplied to the input terminal 13b, the exclusive-OR gate 13c computes an exclusive-OR output between this input signal and a signal (shown in FIG. 4B) delayed by the delay circuit 13d. Thus, a pulse signal whose waveform is shown in FIG. 4C is developed at the output terminal 13e.

As is clear from the waveform diagrams of FIGS. 4A to 4C, the number of pulses outputted is changed in response to the frequency of the input signal, and this output pulse is supplied to a low-pass filter 18 (see FIG. 2) connected to the later stage of the FM-demodulating circuit 13, resulting in a demodulated signal being developed at the output terminal 19 (see FIG. 2). The second demodulating circuit 16 is constructed in a similar fashion.

Referring back to FIG. 2, the demodulated outputs of the first and second demodulating circuits 13 and 16 are added by an adder 17, and the added output from the adder 17 is supplied through the low-pass filter 18 to the output terminal 19.

In the FM demodulating apparatus thus constructed, the delay circuit 12 is used to compensate for a signal delay due to the transversal filter 14 and the Hilbert transform circuit 15.

Figure 5:
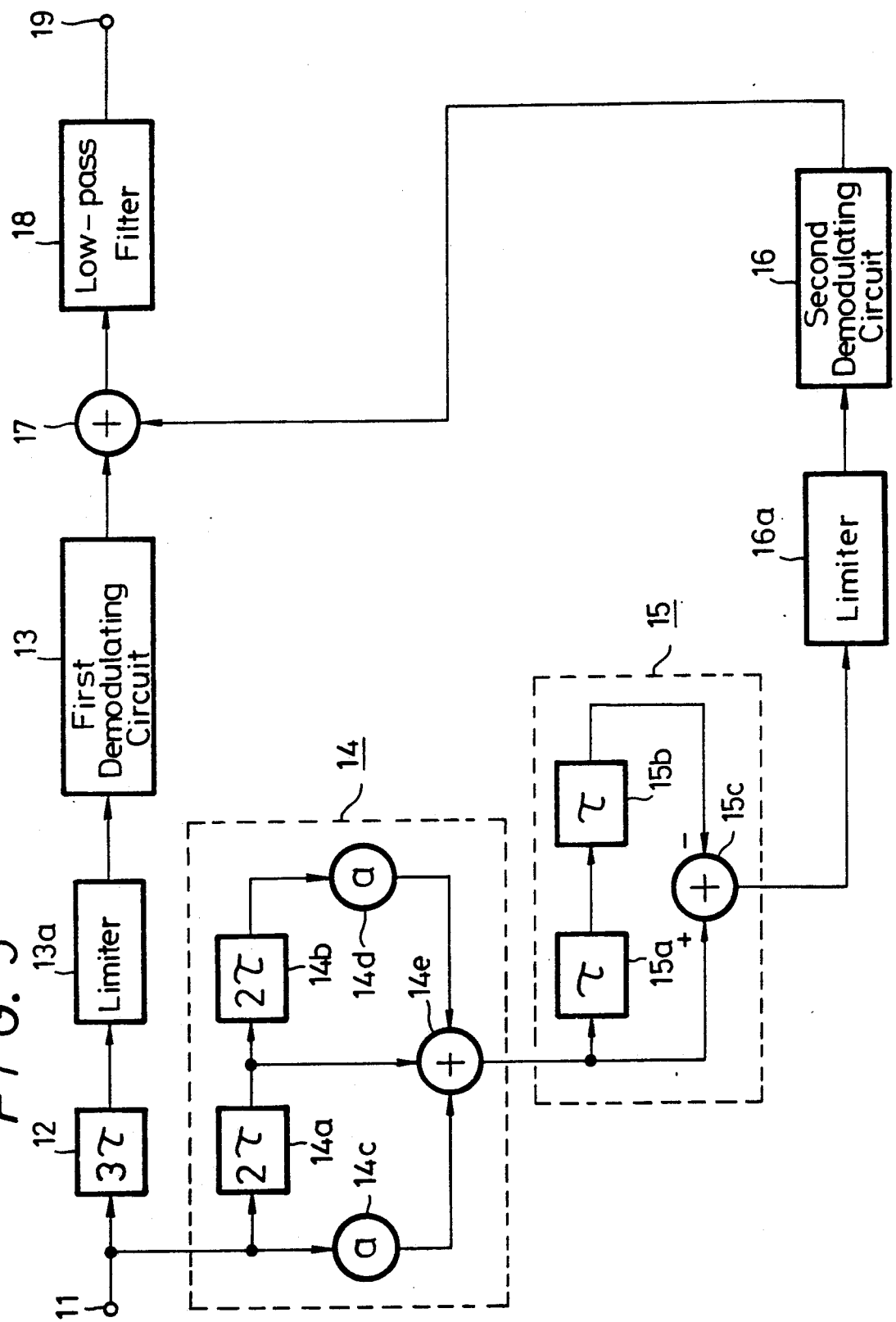
FIG. 5 is a block circuit diagram showing a practical circuit arrangement of the first embodiment shown in FIG. 2.

The circuit arrangements of the transversal filter 14 and the Hilbert transform circuit 15 will be described more fully with reference to FIG. 5. In FIG. 5, like parts corresponding to those of FIG. 2 are marked with the same references and therefore need not be described in detail. In this embodiment, the transversal filter 14 is arranged to have the smallest order.

More specifically, as shown in FIG. 5, the signal applied to the input terminal 11 is supplied to a series circuit of delay circuits 14a and 14b, and an input signal to the delay circuit 14a is supplied through a coefficient multiplier 14c to an adder 14e. An output from the delay circuit 14a is directly supplied to the adder 14e and an output of the delay circuit 14b is supplied through a coefficient multiplier 14d to the adder 14e. In that case, a delay time of each of the delay circuits 14a and 14b is determined as $2\tau$ ($\tau$ is the unit delay time), and the same coefficient a is set in the two coefficient multipliers 14c and 14d. Output signals from the two coefficient multipliers 14c and 14d are added by the adder 14e, and the added signal from the adder 14e is supplied to the Hibert transform circuit 15 as an output of the transversal filter 14.

In the Hilbert transform circuit 15, the output of the transversal filter 14 is supplied to a series circuit of delay circuits 15a and 15b, and an input to the delay circuit 15a is supplied to a subtracter 15c. An output from the delay circuit 15b is supplied to the subtracter 15c. In that case, a delay time of each of the delay circuits 15a and 15b is selected as $\tau$. The subtracter 15c subtracts the signals supplied thereto, and the subtracted signal is supplied through the limiter 16a to the second demodulating circuit 16 as the output of the Hilbert transform circuit 15.

When the transversal filter 14 and the Hilbert transform circuit 15 are constructed as described above, the delay time of the delay circuit 12 connected to the first demodulating circuit 13 side is selected to be $3\tau$.

An operation of the circuit arrangement shown in FIG. 5 will be described by the use of equations.

An output characteristic of the Hilbert transform circuit 15 which constructs the 90-degrees phase shifting circuit is expressed by the following equation.

$$\text{output/input} = +2j \cdot \sin\omega\tau \cdot e^{-j\omega\tau} \qquad (1)$$

Further, an output characteristic of the transversal filter 14 which functions to correct the frequency characteristic is expressed by the following equation.

$$\text{output/input} = (1 + 2 \cdot a \cos 2\omega\tau) \cdot e^{-j2\omega\tau} \qquad (2)$$

Figure 6:
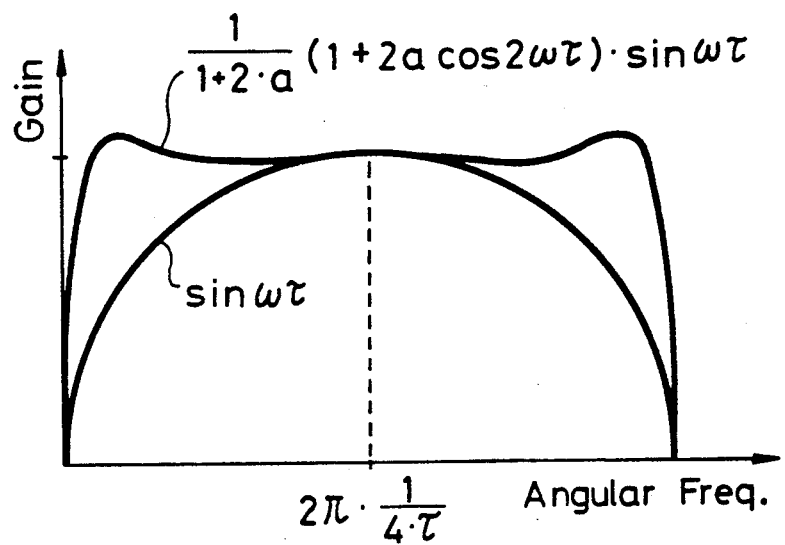
FIG. 6 is a diagram of a frequency characteristic graph used to explain the first embodiment of the present invention.

Frequency characteristics expressed by the above equations (1) and (2) are represented in FIG. 6.

In this embodiment, an overall output characteristic provided by the transversal filter 14 and the Hilbert transform circuit 15 becomes substantially flat as expressed by the following equation.

$$\frac{1}{1 + 2 \cdot a} (1 + 2a\cos 2\omega\tau) \cdot \sin\omega\tau \cdot e^{-j\beta\omega\tau}$$

Therefore, the carrier angular frequency of the FM-modulated wave is determined as $$2\pi \cdot \frac{1}{4\tau}$$

which is a peak value of a sine wave ($\sin \omega\tau$) determined by the Hilbert transform circuit 15.

Assuming that a transfer function of the transversal filter 14 and the Hilbert transform circuit 15 is H ($\omega$), a modulation angular frequency is $\omega m$, a delay time of the delay circuit (delay circuit 13d shown in FIG. 3) involved in the pulse count type demodulating circuit is T and a modulation figure is $\beta$, then the output of the first demodulating circuit 13 is expressed by the following equation.

$$f(t) = \frac{1}{\pi} \cdot \left\{ \omega cT + 2\beta \cdot \sin\frac{\omega m \cdot T}{2} \cdot \cos\left(\omega mt - \frac{\omega m \cdot T}{2}\right) + \right. \tag{3}$$

$$\left. (\sin 2\phi - \sin 2\phi') + (\text{harmonic wave}) \right\}$$

where $$\phi = \{\omega ct + \beta \cdot \sin(\omega mt)\}$$

$$\phi'\{\omega ct - \omega cT + \beta \cdot \sin(\omega mt - \omega mT)\}$$

In the equation (3), the first order item represents the demodulated signal and the second order item represents the spurious signal.

This spurious signal ($\sin 2\phi - \sin 2\phi''$) has a frequency twice as high as that of the carrier and includes a side band wave.

An output of the second demodulating circuit 16 is expressed by the following equation wherein $\phi$ in the equation (3) is substituted into $$\phi'' + \frac{\pi}{2}, \phi'$$

in the equation (3) is substituted into $$\phi''' + \frac{\pi}{2}$$

and the fact that the transfer function H($\omega$) is symmetrical around $$fc\left(=\frac{1}{4\tau}\right)$$

(see FIG. 6) is utilized. Thus, $$f(t) = \frac{1}{\pi} \cdot \left\{ \omega cT + 2\beta \cdot H(\omega c + \omega m) \cdot \sin\frac{\omega mT}{2} \cdot \right. \tag{4}$$

$$\cos\left(\omega mt - \frac{\omega mT}{2}\right) + \sin(2\phi'' + \pi) - \sin(2\phi''' + \pi) +$$

$$\left. (\text{harmonic wave}) \right\}$$

where $$\phi'' = \{\omega ct + \beta H(\omega c + \omega m) \cdot \sin \omega mt\}$$

$$\phi''' = \{\omega ct - \omega cT + \beta \cdot H(\omega c + \omega m) \cdot \sin(\omega mt - \omega mT)\}$$

In the above-described equation (4), the first order item expresses the demodulated signal and the second order item expresses the spurious signal.

In this case, H ($\omega c + \omega m$) is symmetrical about the frequency fc, and assuming that H ($\omega c + \omega m$) indicates the substantially flat frequency characteristic due to the correction of the transversal filter 14, then the following expression is provided as transfer function H ($\omega c + \omega m$) ÷ 1

Accordingly, a spurious signal ($-\sin 2\phi'' + \sin 2\phi'''$) has an opposite phase to that of the spurious signal involved in the output of the first demodulating circuit 13, whereby the spurious signals can be cancelled out by adding the two demodulated outputs by the adder 17.

Further, let it be assumed that a transfer function H ($\omega c + \omega m$) = 1 + $\Delta$ where $|\Delta| \leq 1$. Then, a spurious signal in the added output from the adder 17 becomes $\Delta/2$ for the original signal, thus making it possible to reduce the spurious signal.

While the Hilbert transform circuit having the smallest order is employed in the demodulating apparatus in this embodiment, a Hilbert transform circuit having a higher order may be utilized as the phase shifting circuit, which will be described hereinafter with reference to FIG. 7.

Figure 7:
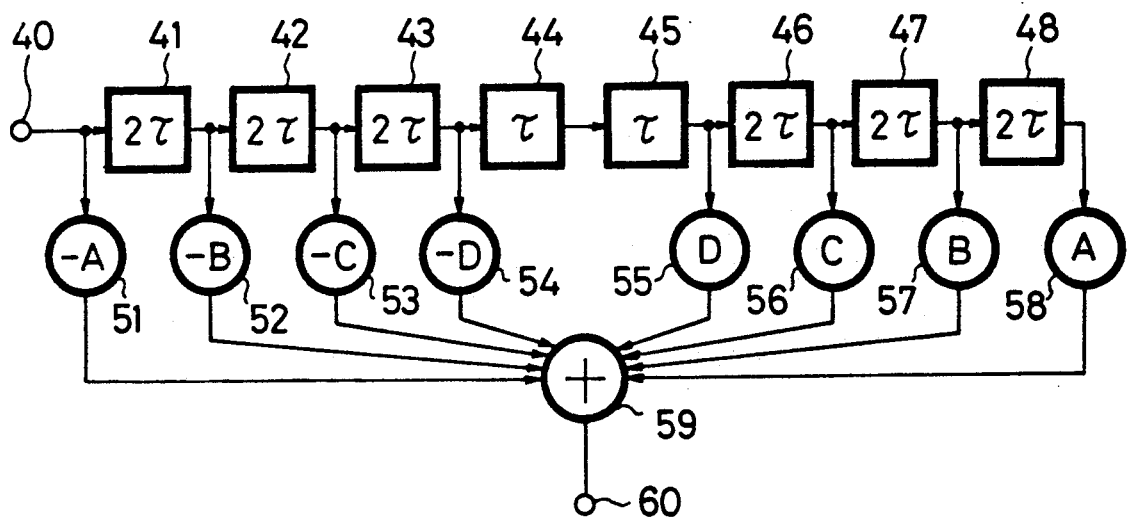
FIG. 7 is a schematic diagram showing a modified example of a Hilbert transform circuit used in the present invention.

It will be seen in FIG. 7 that a signal applied to an input terminal 40 is supplied to a series circuit of delay circuits 41, 42, 43, 44, 45, 46, 47 and 48. In that case, a delay time of each of the delay circuits 41, 42, 43, 46, 47 and 48 is selected to be $2\tau$, whereas a delay time of each of the delay circuits 44 and 45 is selected to be $\tau$.

The signal applied to the input terminal 40 is supplied through a coefficient multiplier 51 to an adder 59 The adder 59 is also supplied with an output from the delay circuit 41 through a coefficient multiplier 52, an output from the delay circuit 42 through a coefficient multiplier 53, an output from the delay circuit 43 through a coefficient multiplier 54, an output from the delay circuit 45 through a coefficient multiplier 55, an output from the delay circuit 46 through a coefficient multiplier 56, an output from the delay circuit 47 through a coefficient multiplier 57 and an output from the delay circuit 48 through a coefficient multiplier 58. In the adder 59, those signals supplied thereto are added, and an added signal from the adder 59 is supplied to an output terminal 60 of the Hilbert transform circuit.

In that case, coefficients are set in the coefficient multipliers 51 to 58 as follows.

Assuming that the coefficient of the coefficient multiplier 58 be represented by A, the coefficient of the coefficient multiplier 57 be represented by B, the coefficient of the coefficient multiplier 56 be represented by C and that the coefficient of the coefficient multiplier 55 be represented by D, then the coefficient of the coefficient multiplier 51 is represented by −A, the coefficient of the coefficient multiplier 52 is represented by −B, the coefficient of the coefficient multiplier 53 is represented by −C, and the coefficient of the coefficient multiplier 54 is represented by −D, respectively. In that event, the respective coefficients A, B, C and D are given as follows.

$$A=3/128, B=1/16, C=21/128, D=79/128$$

Accordingly, an output characteristic of this Hilbert transform circuit is expressed by the following equation.

$$\text{output/input} = -2j \cdot (D \cdot \sin\omega\tau + C \cdot \sin 3\omega\tau + B \cdot \sin 5\omega\tau + A \cdot \sin 7\omega\tau) \quad (5)$$

A second embodiment of the FM demodulating apparatus according to the present invention will be described next with reference to FIG. 8.

Figure 8:
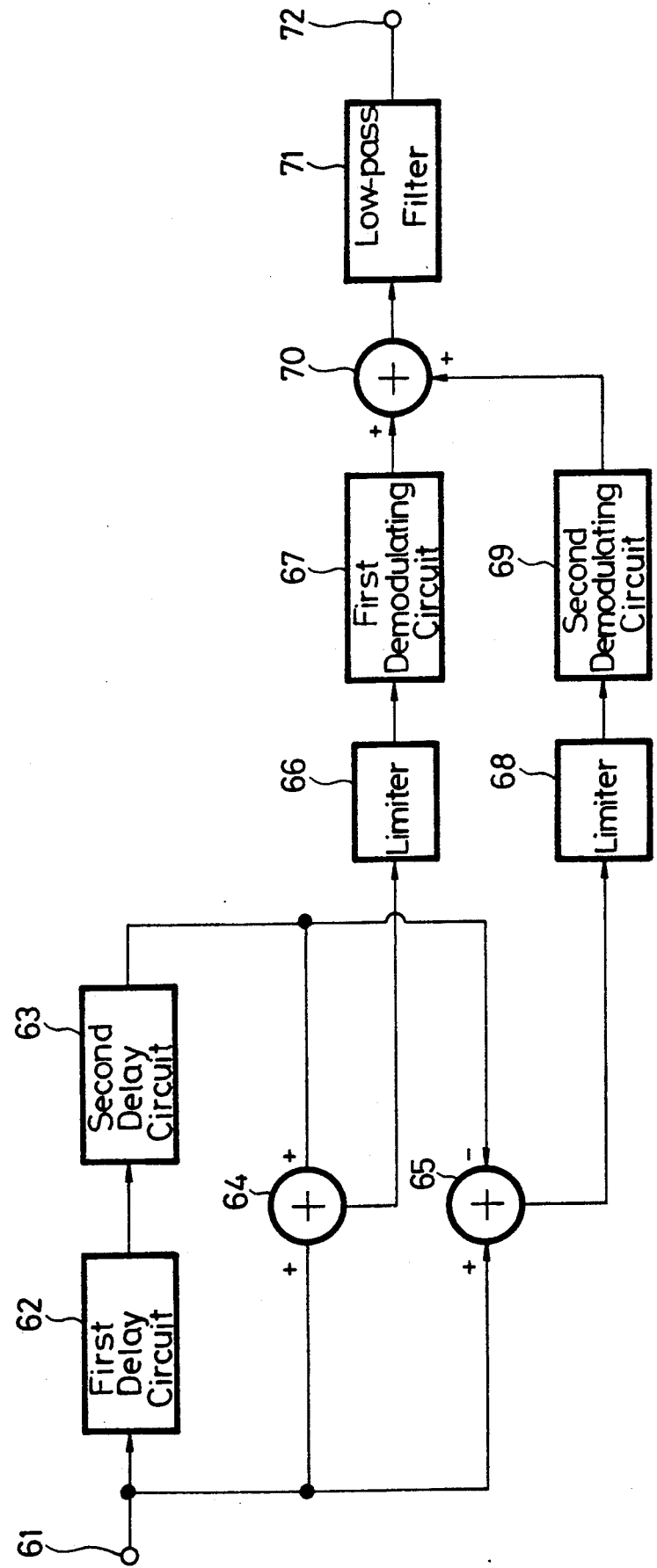
FIG. 8 is a block diagram showing a second embodiment of the FM demodulating apparatus according to the present invention.

Referring to FIG. 8, there is shown a video signal input terminal 61 to which an FM-modulated video signal reproduced from a video tape recorder or the like is supplied. The video signal applied to the input terminal 61 is supplied to a series circuit of first and second delay circuits 62 and 63 which form a first-order Hilbert transform circuit. The video signal applied to the input terminal 61 is also supplied to an adder 64, and an output signal from the second delay circuit 63 is supplied to the adder 64, thereby generated as an added output. The video signal applied to the input terminal 61 is further supplied to a subtracter 65 and the output signal from the second delay circuit 63 is supplied to the subtracter 65, in which the output signal of the second delay circuit 63 is subtracted from the video signal applied to the input terminal 61, thereby provided a subtracted signal.

Accordingly, the first and second delay circuits 62 and 63 and the subtracter 65 constitute the first-order Hilbert transform circuit, whereby the subtracted output of the subtracter 65 becomes a signal whose phase is shifted by 90 degrees relative to the added output of the adder 64. In this embodiment, the delay time $\tau$ of each of the first and second delay circuits 62 and 63 forming the Hilbert transform circuit is selected such that the FM signal, provided as the output of this Hilbert transform circuit, can be prevented from being affected by a zero point.

The added output of the adder 64 is supplied through a limiter 66 to a first demodulating circuit 67, and the subtracted output of the subtracter 65 is supplied through a limiter 68 to a second demodulating circuit 69. Demodulated outputs from the first and second demodulating circuits 67 and 69 are supplied to an adder 70. In that case, as the first and second demodulating circuits 67 and 69, there can be utilized FM demodulating circuits of pulse count type whose characteristics are equal similarly o the first embodiment.

The demodulated outputs of the first and second demodulating circuits 67 and 69 are added by the adder 70, and the added output of the adder 70 is supplied through a low-pass filter 71 to an output terminal 72.

An operation of the FM demodulating apparatus thus constructed will be described with reference to FIGS. 9A to 9E and FIG. 10.

When an FM-modulated signal whose waveform is shown in FIG. 9A is applied to the input terminal 61, the adder 64 generates this FM-modulated signal having no specified delay time of the delay circuit 62 and which has no phase difference as an added output thereof, and the subtracter 65 generates as a subtracted output thereof a signal whose phase is deviated from the phase of the input FM-modulated signal by ¼ cycle (90 degrees) as shown in FIG. 9B. The two output signals from the adder 64 and the subtracter 65 are respectively supplied through the limiters 66 and 68 to the first and second demodulating circuits 67 and 69 from which there are derived demodulated signals with phases deviated by ¼ cycle as shown in FIGS. 9C and 9D. The two demodulated signals of the first and second demodulating circuits 67 and 69 are added by the adder 70, and the adder 70 then generates as an added signal thereof a signal having undesirable high frequency components as high as four times the carrier as shown in FIG. 9E. This added signal is supplied to the low-pass filter 71 which eliminates the undesirable high frequency component more than four times as great the carrier, and a signal component from the low-pass filter 71 is fed to the output terminal 72.

An undesirable high frequency component twice as high as the carrier is not produced in the thus generated demodulated signal, thereby a burden on the low-pass filter 71 being reduced. Therefore, even when the low-pass filter 71 is low in accuracy, the FM demodulating circuit of this embodiment can generate an excellent demodulated signal having no undesirable high frequency component. In that case, since the demodulated signal is processed by the Hilbert transform circuit serving as the 90-degrees phase shifting circuit, the frequency characteristic of the demodulated signal is not changed by the carrier and the undesirable high frequency components can be eliminated satisfactorily.

This will be described more fully in conjunction with equations.

Initially, assuming that the delay times of the first and second delay circuits 62 and 63 be represented as $\tau$, then a transfer function $H_1(\omega)$ of the added output from the adder 64 and a transfer function $H_2(\omega)$ of the subtracted output from the subtracter 65 are expressed by the following equations.

$$H_1(\omega) = 2 \cdot e^{-j\omega\tau} \cdot \cos\omega\tau \quad (6)$$

$$H_2(\omega) = 2 \cdot e^{-j\omega\tau} \cdot j \cdot \sin\omega\tau \quad (7)$$

FIG. 10 illustrates frequency characteristics provided by the transfer functions $H_1(\omega)$ and $H_2(\omega)$ which are given by the aforenoted equations (6) and (7). In this embodiment, a carrier frequency $f_0$ of the FM-modulated wave is selected to be a value at which gains of the two transfer functions $H_1(\omega)$ and $H_2(\omega)$ become equal to each other, as shown in FIG. 10.

Assuming that an angular frequency of the carrier be represented by $\omega_0$ and that a modulated angular frequency of carrier be represented by $\omega_m$, then outputs $E_{FM}$ supplied to the first and second demodulating circuits 67 and 69 from the limiters 66 and 68 are generally expressed by the following equation.

$$E_{FM} = \sin(\omega_0 t) + \rho_1 \cdot \sin(\omega_0 + \omega m)t - \rho_{-1} \cdot \sin(\omega_0 - \omega m)t \quad (8)$$

In the equation (8), it is assumed that the side bands higher than the second side band are sufficiently small. Further, $\rho_1$ is the amplitude of the first upper side band wave relative to the carrier where $\rho_1 = J_1(\beta)/J_0(\beta)$, whereas $\rho_{-1}$ is the amplitude of the first lower side band wave relative to the carrier where $\rho_{-1} = J_1(\beta)/J_0(\beta)$.

Let it now be assumed that the modulation figure $\beta$ be small. Then, outputs $E_{FM}$ of the first and second limiters 66 and 68 are expressed by the following equation.

$$E_{FM} \simeq \sin(\omega_0 t) + \frac{\rho_1 + \rho_{-1}}{2} \cdot \{\sin(\omega_0 + \omega m)t - \sin(\omega_0 - \omega m)t\} \quad (9)$$

Calculating an output $E_{FM1}$ of the first limiter 66 by substituting the transfer function of the equation (6) into the equation (9) yields $$E_{FM1} \simeq \sin(\omega_0 t) + \rho_0 \frac{H_1(\omega_0 + \omega m) + H_1(\omega_0 - \omega m)}{2 \cdot H_1(\omega_0)} \cdot \quad (10)$$

$$\{\sin(\omega_0 + \omega m)t - \sin(\omega_0 - \omega m)t\} = \sin \omega_0 t + \rho_0 \cdot \cos(\omega m \cdot \tau) \cdot$$

$$\{\sin(\omega_0 + \omega m)t - \sin(\omega_0 - \omega m)t\}$$

where $\rho_0 = \frac{\rho_1 + \rho_{-1}}{2}$ is established.

Further, calculating an output $E_{FM2}$ of the second limiter 68 by substituting the transfer function of the equation (7) into the equation (9) yields $$E_{FM2} \simeq \sin\left(\omega_0 t - \frac{\pi}{2}\right) + \rho_0 \cdot \cos(\omega m \cdot \tau) \cdot \quad (11)$$

$$\left\{\sin\left(\omega_0 + \omega m + \frac{\pi}{2}\right)t - \sin\left(\omega_0 - \omega m + \frac{\pi}{2}\right)t\right\}$$

Where, $\rho_0 \cdot \cos(\omega m \cdot \tau)$ in the equations (10) and (11) becomes the modulation figure $\beta$. Accordingly, in the equations (10) and (11), the FM-demodulated video signals becomes video signals in which the two modulation figures are the same and only the phases are different by 90 degrees (i.e., $\pi/2$) so that the undesirable high frequency components are cancelled out by the addition of the adder 70.

According to the FM demodulating circuit of this embodiment, the undesirable high frequency component twice as high as the carrier can be removed and the so-called moiré can be removed. Therefore, the modulation figure $\beta$ which is a ratio between the deviation frequency and the modulation frequency can be equivalently increased so that the moiré can be prevented from being increased in the low carrier. Also, the S/N ratio of the demodulated video signal can be improved, whereby the high definition television video signal can be demodulated.

According to the FM demodulating apparatus of the present invention, the occurrence of the undesirable high frequency components twice as high as the carrier can be suppressed in the video signal such as the high definition television video signal which is extended in the high band, whereby the S/N ratio of the demodulated signal can be improved. In other words, the moiré due to the side band wave twice as great about the carrier can be reduced and the modulation figure $\beta$ can be equivalently increased. Further, the carrier frequency can be decreased so that the S/N ratio can be improved without increasing the moiré in the FM-modulated signal having the low carrier. Furthermore, the moiré occurred in the edge portion of the synchronizing signal can be reduced, thus making it possible to detect a jitter component from a reproduced synchronizing signal.

Having described preferred embodiments of the invention with reference to the accompanying drawings, it is to be understood that the invention is not limited to those precise embodiments and that various variations and modifications could be effected by one skilled in the art without departing from the spirit or scope of the invention as defined in the appended claims.

I claim as my invention:

1. An FM demodulating apparatus, comprising:
   (1) input means for receiving FM-modulated video signals;
   (b) a first demodulator circuit coupled to said input means to receive said FM-modulated video signals;
   (c) a Hilbert transform circuit coupled to said input means for receiving and phase-shifting said FM-modulated video signals by 90 degrees;
   (d) a second demodulator circuit coupled to said Hilbert transform circuit to receive phase-shifted FM-modulated video signals;
   (e) mixing means coupled to said first demodulator circuit and said second demodulator circuit for receiving video signals from each of said first and second demodulator circuits and for deriving FM-demodulated video signals from the received video signals; and
   (f) a transversal filter means interposed between said input means and said Hilbert transform circuit for compensating frequency-characteristics of said FM-modulated video signals to be supplied to said Hilbert transform circuit.

2. An FM demodulating apparatus as cited in claim 1, further comprising: a low pass filter circuit coupled to said mixing circuit for eliminating undesirable high frequency components.

3. An Fm demodulating apparatus, comprising:
   (1) input means for receiving FM-modulated video signals;
   (2) a Hilbert transform circuit coupled to said input means for phase-shifting said FM-modulated video signals by 90 degrees, said Hilbert transform circuit including delay circuits and a subtracting circuit connected to subtract delayed signals output by said delay circuits from said FM-modulated video signals;
   (3) adding means coupled to said delay circuits of said Hilbert transform circuit for adding said delayed signals output by said delay circuits to said FM-modulated video signals;
   (4) a first demodulator circuit coupled to said adding means for demodulating video signals obtained from said adding means;
   (5) a second demodulating circuit coupled to said subtracting circuit of the Hilbert transform circuit for demodulating video signals obtained from said subtracting circuit; and
   (6) a mixing circuit coupled to said first demodulator circuit and to said second demodulating circuit for deriving FM-demodulated video signals from said video signals received from said first and second demodulating circuits.

4. An FM demodulating apparatus as cited in claim 3, further comprising: a low pass filter circuit coupled to said mixing circuit for eliminating undesirable high frequency components.

* * * * *